(12) United States Patent
Nakajima

(10) Patent No.: US 6,787,863 B2
(45) Date of Patent: Sep. 7, 2004

(54) MOS FIELD EFFECT TRANSISTOR AND MOS CAPACITOR

(75) Inventor: Anri Nakajima, Higashi-hiroshima (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 0 days.

(21) Appl. No.: 10/437,119

(22) Filed: May 14, 2003

(65) Prior Publication Data

US 2004/0051152 A1 Mar. 18, 2004

(30) Foreign Application Priority Data

Sep. 13, 2002 (JP) ........................................ 2002-268342

(51) Int. Cl.[7] .......................... H01L 29/76; H01L 29/94; H01L 31/062; H01L 31/113; H01L 31/119
(52) U.S. Cl. ........................ 257/410; 257/301; 257/411
(58) Field of Search ............................... 257/301, 410, 257/411

(56) References Cited

U.S. PATENT DOCUMENTS

2003/0001187 A1 * 1/2003 Basceri et al. .............. 257/301

OTHER PUBLICATIONS

Hiroyuki Ota, et al., "HfO$_2$ MIS Structures with a Silicon Nitride Barrier Layer", *Extended Abstracts of International Workshop on Gate Insulator IWGI 2001*, Nov. 1–2, 2001, Tokyo, Japan.

Kaupo Kukli, et al., "Low–Temperature Deposition of Zironium Oxide–Based Nanocrystalline Films by Alternate Supply of Zr[OC(CH$_3$)$_3$]$_4$ and H$_2$O", *Chemical Vapor Deposition*, vol. 6, No. 6, pp. 297–302, 2000.

Anri Nakajima, et al., "Low–Temperature Formation of Silicon Nitride Gate Dielectrics by Atomic–Layer Deposition", *Applied Physics Letters*, vol. 79, No. 3, pp. 665–667, Jul. 30, 2001.

* cited by examiner

*Primary Examiner*—Ngân V. Ngô
(74) *Attorney, Agent, or Firm*—Staas & Halsey LLP

(57) ABSTRACT

A semiconductor device comprising a silicon substrate and an insulating film adjacent thereto and which operates by applying a voltage to an electrode opposed to the silicon substrate with the insulating film interposed between; wherein an intermediate film is contained that is located between the silicon substrate and the insulating film and has a thickness of 0.2–1 nm. A method for manufacturing such a semiconductor device is also disclosed.

13 Claims, 5 Drawing Sheets

MOS FIELD EFFECT TRANSISTOR AND MOS CAPACITOR

BACKGROUND OF THE INVENTION

1. Field of the Invention

The present invention relates to a semiconductor device and a method for manufacturing it. More particularly, the present invention relates to a semiconductor device such as a MOS field effect transistor or MOS capacitor, which contains a silicon substrate and an insulating film adjacent thereto, and operates by applying a voltage to an electrode in opposition to a silicon substrate with an insulating film interposed there between, and its manufacturing method.

2. Description of the Related Art

MOS field effect transistors (MOSFET) and DRAM capacitors are required to have insulating films that have superior properties. On the other hand, accompanying the growing levels of integration of semiconductor devices in recent years, MOSFET gate insulating films are being required to be increasingly thin due to the requirements of the scaling rule, and MOSFET having a gate length of 100 nm or less are required to have a gate insulating film having a film thickness of 2.0 nm or less. Similarly, the insulating films of DRAM capacitors are being required to be increasingly thin.

In the past, silicon thermal oxidation films were used for the gate insulating films of MOSFET and the gate insulating films of DRAM capacitors. However, efforts to reduce the thickness of these silicon thermal oxidation films have encountered several problems. For example, in the case of the gate insulating film of a MOSFET, as the thickness of the silicon thermal oxidation film decreases, leakage current ends up increasing due to direct tunnel current. In order to solve such problems, it is necessary to develop a satisfactory insulating film having a high dielectric constant that can inhibit leak current even if the equivalent oxide thickness (EOT) is small.

Examples of satisfactory insulating films having a high dielectric constant that are currently considered most likely to take the place of silicon thermal oxidation films from the viewpoint of their thermal stability include high dielectric constant, metal oxide insulating films such as hafnium oxide or zirconium oxide. However, hafnium oxide and zirconium oxide films are readily permeable to oxygen. Consequently, when these films are formed by deposition in a furnace, trace amounts of residual oxygen in the furnace diffuse through the formed thin film and react with silicon at the interface with the silicon substrate of the lower layer, which in turn ends up causing the formation of an interface layer having a low dielectric constant.

According to a method proposed in the past to avoid this problem, a silicon nitride film is pre-formed on a silicon substrate in the form of an oxygen diffusion barrier layer by low pressure chemical vapor deposition (LPCVD) or plasma nitridation, and a hafnium oxide layer or zirconium oxide layer is deposited thereon. For example, the formation of a silicon nitride film as an oxygen diffusion barrier layer for hafnium oxide by plasma CVD is described in H. Ota, et al., $HfO_2$ MIS Structures with a Silicon Nitride Barrier Layer, Extended Abstracts of International Workshop on Gate Insulator, IWGI 2001, Nov. 1–2, 2001, Tokyo, pp. 188–190.

The dielectric constant of silicon nitride films used as an oxygen diffusion barrier layer is comparatively low. Consequently, in the case the silicon nitride film of the barrier layer is thick, the dielectric constant of the overall insulating film stack, including the hafnium oxide film or zirconium oxide film formed thereon, ends up decreasing considerably. Thus, a silicon nitride film for use as an oxygen diffusion barrier layer is required to be as thin as possible.

However, in the case of the previously proposed vacuum chemical vapor deposition or plasma nitridation, it was extremely difficult to accurately form a thin silicon nitride film in the form of a layer on the order of several molecules thick that is effective in inhibiting the decrease in the dielectric constant in terms of the overall insulating film stack. In addition, it was also difficult to ensure adequate thin film quality and uniform film thickness.

A known method that is effective in forming a thin film only one molecule or several molecules thick is atomic layer deposition (ALD) method. For example, the formation of a zirconium oxide film by ALD is described in K. Kukli, et al., Low-Temperature Deposition of Zirconium Oxide-Based Nanocrystalline Films by Alternate Supply of $Zr[OC(CH_3)_3]_4$ and $H_2O$, Chem. Vap. Deposition, Vol. 6, No. 6, pp. 297–302 (2000). The formation of a silicon nitride gate insulating film by ALD is described in A. Nakajima, et al., Low-temperature formation of silicon nitride gate dielectrics by atomic-layer deposition, Applied Physics Letters, Vol. 79, No. 5, pp. 665–667 (2001). However, the use of a silicon nitride film grown by ALD as an oxygen diffusion barrier layer for the gate insulating layer of a MOSFET as in the present invention has heretofore not been known.

SUMMARY OF THE INVENTION

Thus, an object of the present invention is to provide a semiconductor device that uses a high dielectric constant insulating film in the manner of a gate insulating film formed on a silicon substrate, and a thin film having superior film quality and uniform film thickness as an intermediate layer in the manner of a barrier layer and so forth between the insulating film and the silicon substrate.

The semiconductor device provided by the present invention comprises a silicon substrate and an insulating film adjacent thereto and which operates by applying a voltage to an electrode opposed to the silicon substrate with the insulating film interposed between, and includes a MOSFET, MOS capacitor, particularly DRAM capacitor, and so forth.

More specifically, the semiconductor device of the present invention is a semiconductor device in which a thin intermediate layer formed by ALD is provided between the silicon substrate and the insulating film, and the thickness of the intermediate layer is 0.2–1 nm.

DETAILED DESCRIPTION OF THE INVENTION

In the semiconductor device of the present invention, a thin film formed by ALD is used as an intermediate layer interposed between a silicon substrate and an insulating film thereon. ALD refers to a technology in which two or more types of raw material substances that contain constituent elements of the film to be formed are alternately supplied to grow the target film on a substrate, and film growth takes place in units of monomolecular layers. Consequently, this method is advantageous since the thickness of the formed film can be precisely controlled, and the quality of the formed film is kept uniform.

A typical example of a semiconductor device of the present invention is a MOSFET that controls the current that flows between a source region and drain region provided on a silicon substrate according to the voltage applied to a gate electrode by having an insulating film (gate insulating film) on a silicon substrate and a gate electrode thereon, and the following explanation of the present invention is provided based on the example of this MOSFET.

In a MOSFET as one embodiment of the present invention, an intermediate layer of an insulating film formed by ALD is located between a silicon substrate and gate insulating film. This intermediate layer is provided with characteristics unique to a film obtained by ALD in which a film is grown in units of monomolecular layers, and has a uniform thickness on the order of 0.2–1 nm equivalent to the thickness of a single molecule to several molecules. Moreover, the average surface roughness Ra of this intermediate layer is extremely small. Such an intermediate layer formed to have an extremely thin and uniform thickness can function as an effective oxygen diffusion barrier layer for a hafnium oxide, zirconium oxide or other high dielectric constant insulating film that is effective for inhibiting leakage current resulting from direct tunnel current considered to present a problem in MOSFET that have become increasingly fine in recent years, and is readily permeable to oxygen and facilitates the formation of an interface layer having a low dielectric constant between itself and the silicon substrate of the lower layer. In addition to the hafnium oxide and zirconium oxide mentioned above, other examples of high dielectric constant materials for use as insulating films include aluminum oxide, praseodymium oxide, lanthanum oxide, cerium oxide, hafnium silicate, zirconium silicate, lutetium oxide, dysprosium oxide, gadolinium oxide, ytterbium oxide, yttrium oxide, hafnium aluminate and zirconium aluminate.

Although the following provides an additional explanation of the present invention through its specific embodiments, the present invention is not limited to these embodiments.

Figure 1:
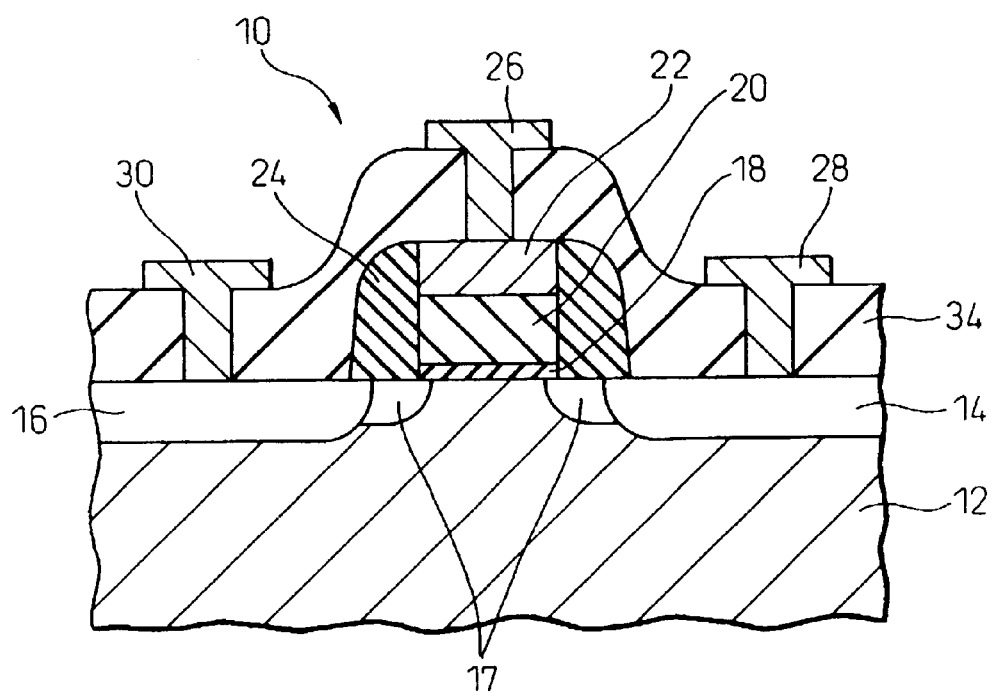
FIG. 1 schematically illustrates a MOSFET of a semiconductor device according to the present invention.

FIG. 1 is a schematic illustration of a MOSFET that is a semiconductor device according to the present invention. In this MOSFET 10 shown in the drawing, a source region 14, a drain region 16 and lightly doped drain regions 17 are provided on a silicon substrate 12, and a stack structure comprised of a barrier layer (intermediate layer) 18, a gate insulating film 20 and a gate electrode 22 are located on silicon substrate 12 at the channel section-between source region 14 and drain region 16. Sidewalls 24 are located on the lateral surfaces of this stack structure, and a gate lead electrode 26 is connected to a gate electrode 22. A source electrode 28 and a drain electrode 30 are connected to source region 14 and drain region 16, respectively. Gate lead electrode 26 and the upper sections of source electrode 28 and drain electrode 30 are exposed on a protective insulating film 34.

This MOSFET 10 can be manufactured in the manner described below.

Figure 2A:
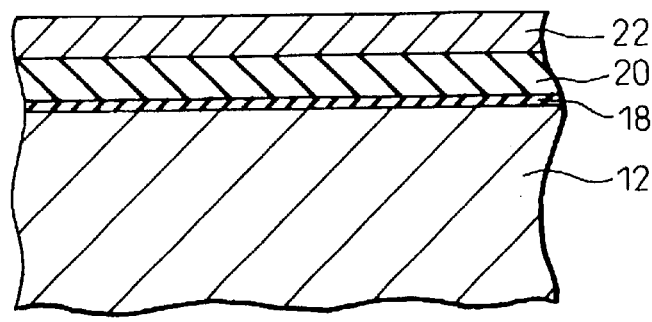
FIGS. 2A to 2C show the steps of the first half of a method for manufacturing the MOSFET shown in FIG. 1.

As shown in FIG. 2A, a silicon nitride film 18 for the barrier layer, a zirconium oxide film 20 for the gate insulating film, and a polysilicon film 22 for the gate electrode are sequentially deposited on silicon substrate 12.

Silicon nitride film 18 is formed in the form of an extremely thin film of, for example, 0.3±0.1 nm by ALD in which tetrachlorosilane ($SiCl_4$) gas and ammonia ($NH_3$) gas are alternately supplied to silicon substrate 12. More specifically, a cycle is repeated consisting of alternately supplying $SiCl_4$ gas at 340–375° C. and 23 kPa and $NH_3$ gas at 550° C. and 40 kPa (a silicon nitride film having a thickness of 0.3±0.1 nm is formed in about 2 cycles). Following deposition, the silicon nitride film is immediately annealed for 90 minutes at 550° C. in the presence of an $NH_3$ gas atmosphere ($NH_3$ gas pressure: 10–100 kPa) within the ALD device. When the average surface roughness Ra of the silicon nitride film formed in this manner by ALD was measured using an atomic force microscope (AFM), it was determined to be 0.023 nm in the case of a film having a thickness before annealing of 0.9 nm as measured by elliptic polarization.

Zirconium oxide film 20 can also be formed by repeating, for example, 2–15 cycles of alternately supplying zirconium t-butoxide ($Zr(OC_4H_9)_4$, ZTB) and water ($H_2O$) using ALD. The substrate temperature during deposition is controlled to 200° C., and the pressure of the ZTB and water is controlled to 0.04 kPa and 0.13–1.05 kPa (typically, 0.7 kPa), respectively. Following deposition, the zirconium oxide film is immediately annealed with $N_2$ for 5 minutes at 400° C. within the ALD device. In this manner, in the case of using ALD for both the formation of the intermediate layer and insulating film, treatment can be carried out continuously under vacuum conditions or inert gas conditions.

The formation of polysilicon film 22 is carried out by known CVD.

Figure 2B:
Figure 2B:
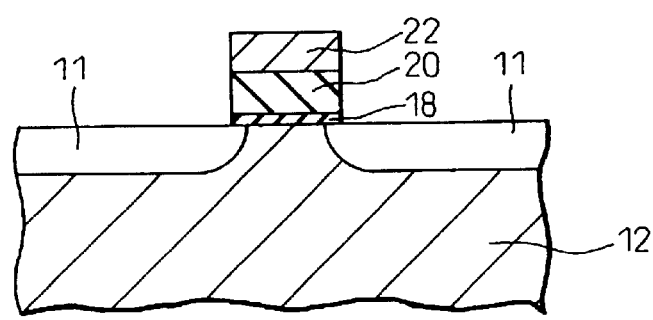

Continuing, as shown in FIG. 2B, polysilicon film 22, zirconium oxide film 20 and silicon nitride film 18 are patterned to form a gate stack structure, and ions 17 such as $BF_2^+$ ions are implanted into silicon substrate 12 to form an ion implanted region 11. Electron beam (EB) lithography, for example, is used for patterning. Ion implanted region 11 is formed for a lightly doped drain (LDD) structure provided with a p region adjacent to the source region and drain region formed by additional ion implantation in a later step. The channel field strength in the MOSFET is moderated by this LDD structure, resulting in improved withstand voltage and reliability of the device.

Figure 2C:
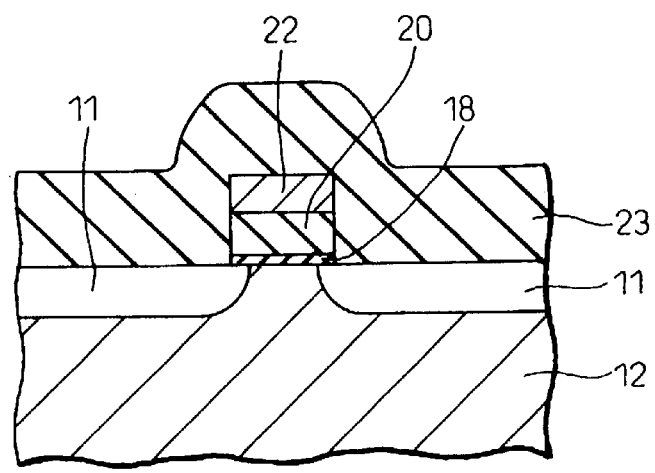
Figure 3A:
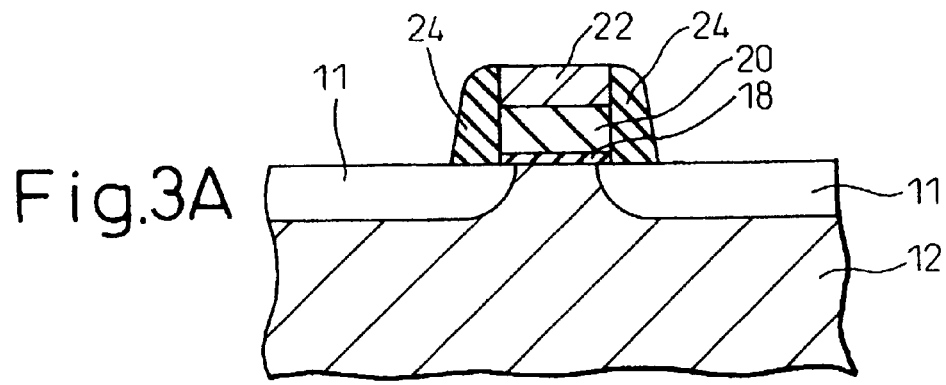
FIGS. 3A to 3C show the steps of the second half of a method for manufacturing the MOSFET shown in FIG. 1.

Next, as shown in FIG. 2C, a silicon oxide film 23 is deposited at a thickness of 200–500 nm over the entire surface of the substrate by, for example, CVD, and this is followed by anisotropic etching of this silicon oxide film 23 by reactive ion etching (RIE) to form sidewalls 24 located on the lateral surface sections of the gate stack structure as shown in FIG. 3A.

Figure 3B:
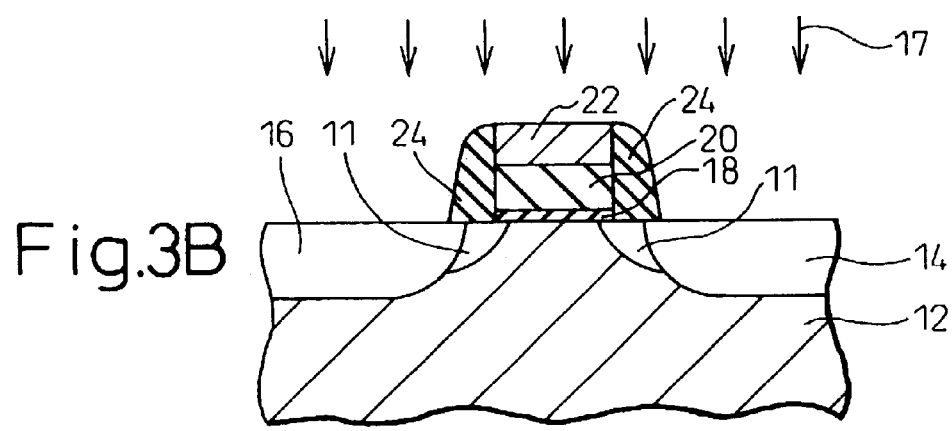

Next, as shown in FIG. 3B, p+ source region 14 and p+ drain region 16 are formed by implanting the same ion species 17 as used to previously create ion implanted region (p region) 11 (at, for example, an implantation energy of 20 keV and dose of $5\times10^{15}/cm^2$), followed by annealing for 10 minutes at 850° C. in an $N_2$ atmosphere.

Figure 3C:
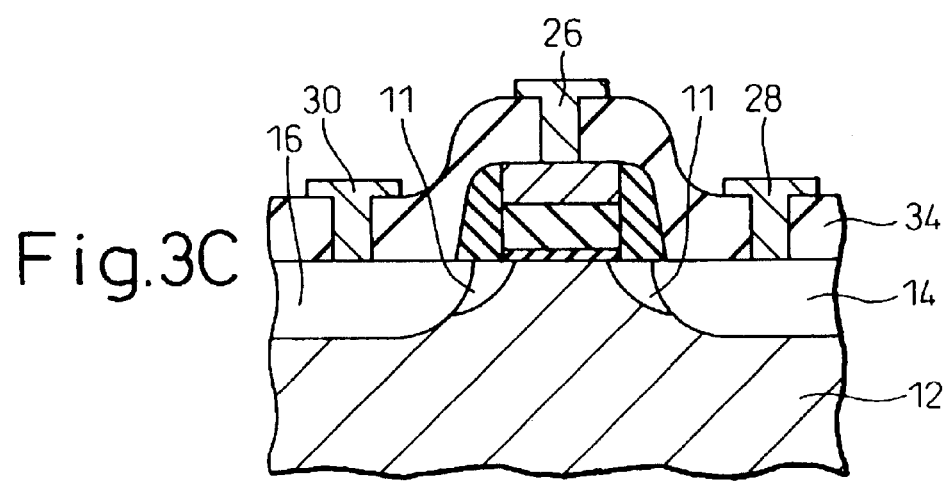

Next, as shown in FIG. 3C, a silicon nitride or silicon oxide protective insulating film (passivation film) 34 is formed by, for example, APCVD, and after forming openings passing through source region 14, drain region 16 and gate electrode 22, respectively, in this film 34, a metal material such as aluminum or copper is deposited by, for example, sputtering followed by patterning to form source electrode 28, drain electrode 30 and gate lead electrode 26.

The semiconductor device of the present invention is characterized by having an intermediate layer interposed between a silicon substrate and insulating film thereon, which is an extremely thin film of uniform quality formed by ALD. In addition to the silicon nitride used in the above example, this intermediate layer may be formed with, for example, titanium nitride or tantalum nitride, has a uniform thickness on the order of 0.2–1 nm equivalent to the thickness of a single molecule or several molecules, and has a small average surface roughness on the order of, for example, 0.013–0.033 nm.

In the case of using a method other than ALD, since deposition cannot be performed in monomolecular layer units as in ALD, such an extremely thin film of uniform thickness cannot be formed, and average surface roughness ends up increasing correspondingly. For example, in the case of forming an extremely thin silicon nitride film using CVD, due to the occurrence of unevenness during deposition onto the substrate, it is difficult to form a uniform film. When a silicon nitride film was deposited at a thickness of 1.7 nm onto a substrate by CVD, the average surface roughness was about 0.042 nm. When thickness was increased, the average surface roughness of the silicon nitride film formed by CVD decreased, and the average surface roughness at a film thickness of, for example, 7.3 nm, was about 0.023 nm.

In a MOSFET of the semiconductor device of the present invention, a thin, uniform film formed by ALD is used for the intermediate layer (barrier layer) between the silicon substrate and gate insulating film, and as a result, a decrease in the dielectric constant of the entire insulating film stack, including the intermediate layer and gate insulating film, is prevented. Thus, in a MOSFET in which a gate insulating film is used that was formed with a high dielectric constant material like hafnium oxide or zirconium oxide, and in which an intermediate layer (barrier layer) is inserted between the silicon substrate and gate insulating film, the benefits of a high dielectric constant inherent to gate insulating film materials can be enjoyed. The dielectric constant of an insulating film stack (silicon nitride layer: 0.5 nm, zirconium oxide layer: 4.2 nm), in which the equivalent oxide thickness (EOT), as obtained from accumulation capacitance, was 1.6 nm, and the physical thickness as determined with a transmission electron microscope (TEM) was 4.7 nm, was 12.

Figure 4:
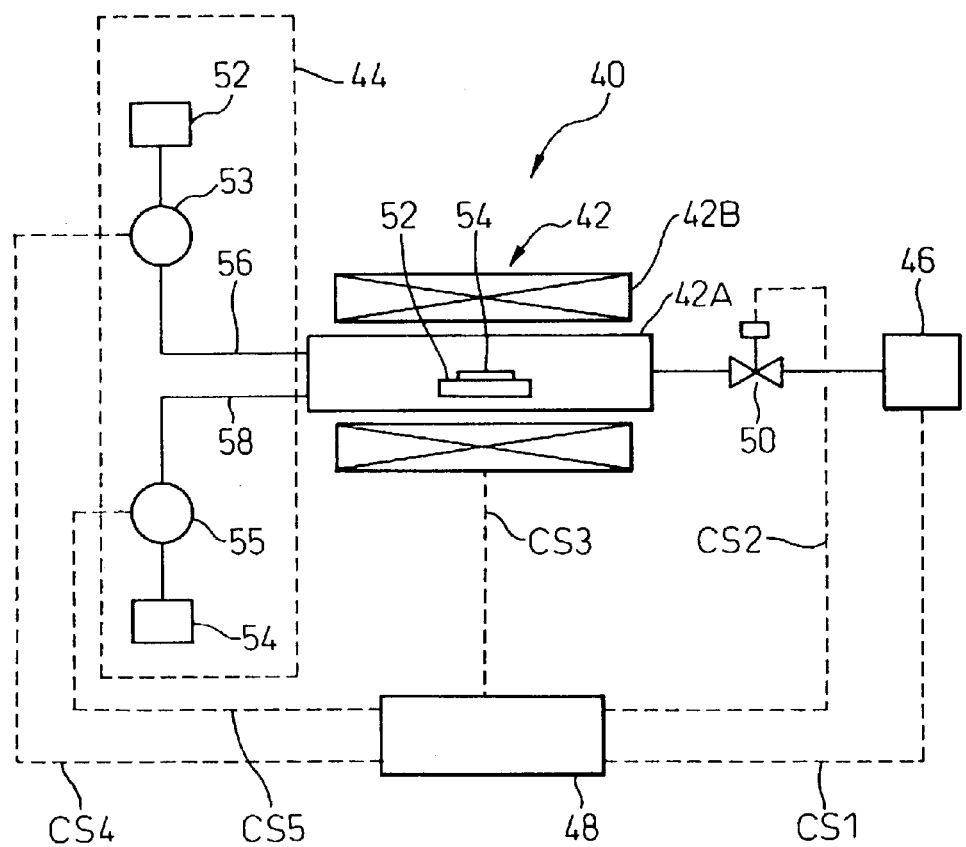
FIG. 4 illustrates an ALD device used to form an intermediate layer in the semiconductor device of the present invention.

The formation of silicon nitride film 18 can be carried out by using an ALD device 40 shown in FIG. 4. This ALD device 40 is composed of an electric furnace 42, a gas supply section 44, a vacuum device 46, and a control device 48 that controls them.

Electric furnace 42 is composed of a reaction tube 42 made of quartz, for example, that is capable of being evacuated, and a heater 42B, and reaction tube 42A is connected to vacuum device 46 through a valve 50. Vacuum device 46 and valve 50 are respectively controlled by control signals CS1 and CS2 from control device 48. A susceptor 52, on which is placed a substrate 54 on which a silicon nitride film is deposited, is housed inside reaction tube 42A. Heater 42B is controlled by a control signal CS3 from control device 48 based on temperature data of substrate 54 measured by a thermocouple (not shown).

Gas supply section 44 is composed of gas supply means 53 and 55, comprised of a mass flow controller, valves, pressure regulator and so forth for supplying supply gases from each $SiCl_4$ gas source 52 and $NH_3$ gas source 54 to reaction tube 42A under prescribed conditions, and lines 56 and 5B that supply each gas to reaction tube 42A. Gas supply means 53 and 55 are respectively controlled by control signals CS4 and CS5 from control device 48 so as to alternately introduce $SiCl_4$ and $NH_3$ gas into reaction tube 42A of electric furnace 42 at a prescribed pressure and for a prescribed time.

Vacuum device 46 is composed of, for example, a turbo molecular pump and an oil-sealed rotary pump that is also used for roughing, and is capable of drawing a vacuum within reaction tube 42A to, for example, about $1.33 \times 10^{-5}$ to $1.33 \times 10^{-6}$ Pa.

Figure 5:
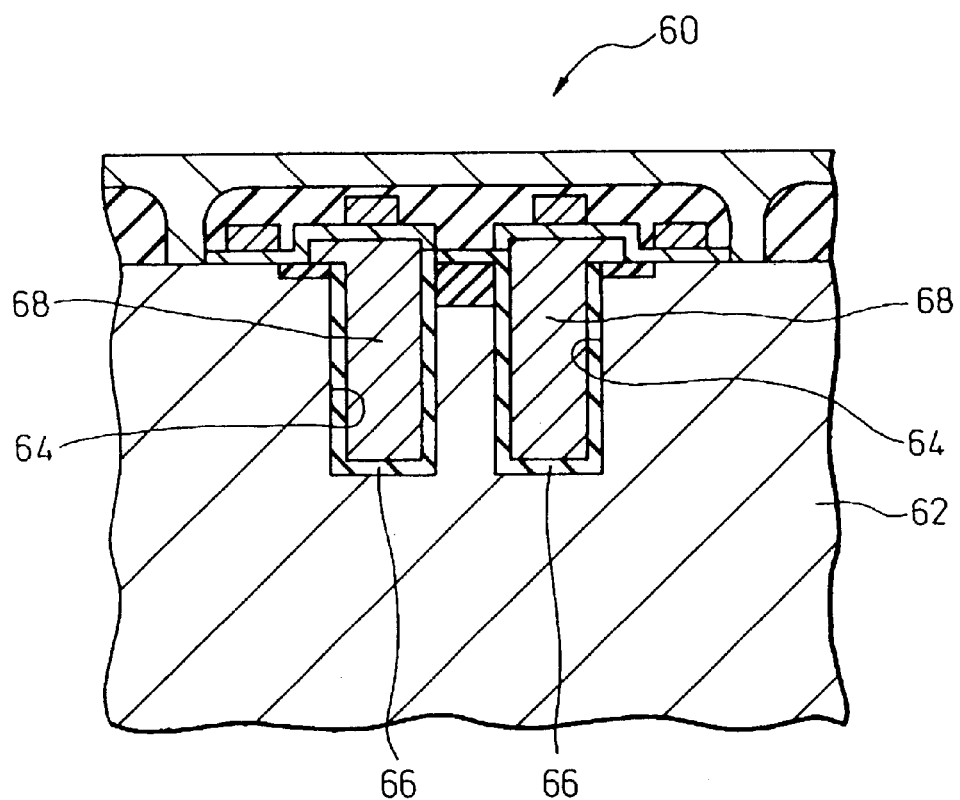
FIG. 5 illustrates an example of a DRAM capacitor of a semiconductor device according to the present invention.

Although the semiconductor device previously explained with reference to FIGS. 1 through 3 is a p-type MOSFET, it goes without saying that the semiconductor device of the present invention may also be an n-type MOSFET. Moreover, the semiconductor device of the present invention may also be a DRAM capacitor that uses a high dielectric constant insulating film. An example of such a DRAM capacitor is schematically shown in FIG. 5.

DRAM capacitor 60 shown in this drawing is a DRAM capacitor that is known as a "trench type" in which capacitor insulating films 66 are formed along the insides of trenches 64 provided in a silicon substrate 62, and electrodes 68 embedded with an electrically conductive material are formed within the recesses surrounded by these insulating films 66. A capacitor element is formed by this silicon substrate 62, insulating films 66 and electrodes 68.

In this DRAM capacitor 60, by providing an extremely thin insulating film (not shown) formed by ALD between silicon substrate 62 and capacitor insulating film 66 located along the inside of trench 64, a high-performance capacitor can be obtained that effectively utilizes the characteristics of the high dielectric constant insulating film used as the capacitor insulating film.

As has been explained above, according to the present invention, a semiconductor device can be used practically that uses a high dielectric constant insulating film typically formed from hafnium oxide or zirconium oxide.

What is claimed is:

1. A semiconductor device comprising a silicon substrate and an insulating film adjacent thereto and which operates by applying a voltage to an electrode opposed to the silicon substrate with the insulating film interposed between; wherein an intermediate film is contained that is located between the silicon substrate and the insulating film and has a thickness of 0.2–1 nm.

2. The semiconductor device according to claim 1, wherein the insulating film is a hafnium oxide, zirconium oxide, aluminum oxide, praseodymium oxide, lanthanum oxide, cerium oxide, hafnium silicate, zirconium silicate, lutetium oxide, dysprosium oxide, gadolinium oxide, ytterbium oxide, yttrium oxide, hafnium aluminate or zirconium aluminate film.

3. The semiconductor device according to claim 1, wherein the intermediate layer is a silicon nitride, titanium nitride or tantalum nitride layer.

4. The semiconductor device according to claim 1, wherein said semiconductor device is a MOSFET having a gate insulating film on a silicon substrate and a gate electrode located on this gate insulating film, and the intermediate layer is located between the silicon substrate and the gate insulating film.

5. The semiconductor device according to claim 1, wherein said semiconductor device is an MOS capacitor provided with an electrode opposed to a silicon substrate with an insulating film inserted between the silicon substrate and the electrode, and the intermediate layer is located between the silicon substrate and the insulating film.

6. The semiconductor device according to claim 5, wherein the MOS capacitor is a capacitor for a DRAM.

7. A method for manufacturing a semiconductor device comprising a silicon substrate and an insulating film adjacent thereto, which operates by applying a voltage to an electrode opposed to the silicon substrate with the insulating film interposed between, and contains an intermediate film that is located between the silicon substrate and the insulating film and has a thickness of 0.2–1 nm; wherein the intermediate layer is formed by atomic layer deposition.

8. The method according to claim 7, wherein the intermediate layer is formed from silicon nitride, titanium nitride or tantalum nitride.

9. The method according to claim 7, wherein the insulating film is formed with hafnium oxide, zirconium oxide, aluminum oxide, praseodymium oxide, lanthanum oxide, cerium oxide, hafnium silicate, zirconium silicate, lutetium oxide, dysprosium oxide, gadolinium oxide, ytterbium oxide, yttrium oxide, hafnium aluminate or zirconium aluminate.

10. The method according to claim 7, wherein said semiconductor device is a MOSFET having a gate insulating film on a silicon substrate and a gate electrode located on this gate insulating film, and the intermediate layer is located between the silicon substrate and the gate insulating film.

11. The method according to claim 7, wherein said semiconductor device is an MOS capacitor provided with an electrode opposed to a silicon substrate with an insulating film inserted between the silicon substrate and the electrode, and the intermediate layer is located between the silicon substrate and the insulating film.

12. The method according to claim 7, wherein the insulating film is formed by atomic layer deposition.

13. The method according to claim 12, wherein formation of the intermediate layer and the insulating film by atomic layer deposition is carried out by continuous treatment under vacuum conditions or inert gas conditions.

* * * * *